United States Patent
Nguyen et al.

(10) Patent No.: US 7,880,622 B2
(45) Date of Patent: *Feb. 1, 2011

(54) INDUSTRIAL ETHERNET SWITCH

(75) Inventors: Yen Teresa Nguyen, Austin, TX (US); Manrique J. Brenes, Corona del Mar, CA (US); James E. Collinge, Austin, TX (US)

(73) Assignee: Cisco Technology, Inc., San Jose, CA (US)

( * ) Notice: Subject to any disclaimer, the term of this patent is extended or adjusted under 35 U.S.C. 154(b) by 813 days.

This patent is subject to a terminal disclaimer.

(21) Appl. No.: 11/852,717

(22) Filed: Sep. 10, 2007

(65) Prior Publication Data

US 2008/0001765 A1    Jan. 3, 2008

Related U.S. Application Data

(63) Continuation of application No. 10/377,570, filed on Feb. 28, 2003, now Pat. No. 7,268,690.

(51) Int. Cl.
*G08B 17/00* (2006.01)

(52) U.S. Cl. .................. 340/588; 340/501; 340/539.27; 370/241; 370/250; 370/264

(58) Field of Classification Search ......... 340/588–589, 340/501, 539.27; 361/679, 703, 709; 370/216–228, 370/240–250, 264, 529.27
See application file for complete search history.

(56) References Cited

U.S. PATENT DOCUMENTS 3,696,210 A    10/1972    Peterson et al. ............. 370/242

(Continued)

FOREIGN PATENT DOCUMENTS

GB    2310086    8/1997

(Continued)

OTHER PUBLICATIONS

PCT Invitation to Pay Additional Fees (PCT Article 17(3)(a) and Rule 40.1); mailed Aug. 23, 2004 Re: PCT/US2004/005823; filed Feb. 24, 2004 (6 pgs.).

(Continued)

*Primary Examiner*—Daniel Wu
*Assistant Examiner*—Son M Tang
(74) *Attorney, Agent, or Firm*—Baker Botts L.L.P.

(57) ABSTRACT

According to one embodiment of the invention a rugged Ethernet switch includes a housing and a passive cooling system associated with the housing and being devoid of fans as operable to cool the Ethernet switch. Ethernet switch also includes software operable to perform at least one of the functions selected from the group consisting of multiple spanning, rapid spanning, cluster management and IGMP snooping and querying. According to another embodiment, a rugged Ethernet switch includes a housing having a plurality of perforations formed therein for cooling the Ethernet switch. The switch also includes a passive cooling system be devoid of fans and that is operable to cool the Ethernet switch. A temperature sensor is operable to measure a temperature of the Ethernet switch is included as is an alarm software responsive to the temperature sensor and operable to initiate an alarm when a measured temperature of the Ethernet switch exceeds a particular limit.

17 Claims, 10 Drawing Sheets

U.S. PATENT DOCUMENTS

| | | | | |
|---|---|---|---|---|
| 4,045,624 | A | 8/1977 | Browne | 370/244 |
| 4,388,715 | A | 6/1983 | Renaudin et al. | 370/244 |
| 4,660,194 | A | 4/1987 | Larson et al. | 370/244 |
| 5,615,224 | A | 3/1997 | Cohen | 372/36 |
| 5,651,260 | A | 7/1997 | Goto et al. | 62/126 |
| 5,714,938 | A | 2/1998 | Schwabl | 340/584 |
| 5,764,482 | A | 6/1998 | Meyer et al. | 361/699 |
| 5,771,274 | A | 6/1998 | Harris | 379/22.03 |
| 5,793,922 | A | 8/1998 | Kim | 386/46 |
| 5,825,618 | A | 10/1998 | Schnoor et al. | 361/686 |
| 5,898,557 | A | 4/1999 | Baba et al. | 361/103 |
| 5,920,264 | A | 7/1999 | Kim et al. | 340/584 |
| 5,973,922 | A | 10/1999 | Kamphuis | 361/704 |
| 6,005,700 | A | 12/1999 | Pressler et al. | 398/117 |
| 6,175,501 | B1 | 1/2001 | Bortolini et al. | 361/720 |
| 6,381,214 | B1 | 4/2002 | Prasad | 370/230.1 |
| 6,411,506 | B1 | 6/2002 | Hipp et al. | 361/686 |
| 6,452,809 | B1 | 9/2002 | Jackson et al. | 361/796 |
| 6,496,118 | B1 | 12/2002 | Smith | 340/584 |
| 6,549,689 | B2 | 4/2003 | Furuici et al. | 385/16 |
| 6,632,008 | B2 | 10/2003 | Kalkbrenner | 362/554 |
| 6,633,998 | B1 | 10/2003 | Lau | 714/22 |
| 6,636,478 | B1 | 10/2003 | Sensel et al. | 370/216 |
| 6,636,499 | B1 | 10/2003 | Dowling | 370/338 |
| 6,644,395 | B1 | 11/2003 | Bergin | 165/185 |
| 6,661,772 | B2 | 12/2003 | Matsuno et al. | 370/216 |
| 6,724,635 | B2 * | 4/2004 | Larson et al. | 361/736 |
| 6,754,085 | B2 | 6/2004 | Kalkbrenner | 361/752 |
| 6,780,047 | B1 | 8/2004 | Laity et al. | 439/501 |
| 6,798,744 | B1 | 9/2004 | Loewen et al. | 370/235 |
| 6,808,289 | B2 | 10/2004 | Reed | 362/198 |
| 6,835,453 | B2 | 12/2004 | Greenwood et al. | 428/343 |
| 6,853,316 | B2 | 2/2005 | Payson et al. | 340/999 |
| 7,032,119 | B2 * | 4/2006 | Fung | 713/320 |
| 7,032,129 | B1 * | 4/2006 | Borresen et al. | 714/13 |
| 7,212,492 | B1 * | 5/2007 | Au et al. | 370/229 |
| 7,411,948 | B2 * | 8/2008 | Danner et al. | 370/372 |
| 2002/0025710 | A1 | 2/2002 | Payson et al. | 439/320 |
| 2002/0104030 | A1 | 8/2002 | Ahn | 713/310 |
| 2002/0124114 | A1 | 9/2002 | Bottom et al. | 709/251 |
| 2002/0194412 | A1 | 12/2002 | Bottom | 710/302 |
| 2003/0081604 | A1 | 5/2003 | Danner et al. | 370/392 |
| 2003/0081620 | A1 | 5/2003 | Danner et al. | 370/400 |
| 2003/0123453 | A1 | 7/2003 | Ooghe et al. | 370/395.53 |
| 2003/0135601 | A1 * | 7/2003 | Pozzuoli | 709/223 |
| 2003/0163561 | A1 | 8/2003 | Lee et al. | 709/224 |
| 2004/0017779 | A1 * | 1/2004 | Chen et al. | 370/245 |
| 2004/0095720 | A1 | 5/2004 | Elo et al. | 361/690 |
| 2004/0179470 | A1 | 9/2004 | Nguyen et al. | 370/216 |
| 2007/0223470 | A1 * | 9/2007 | Stahl | 370/389 |
| 2008/0056240 | A1 * | 3/2008 | Ellis et al. | 370/352 |

FOREIGN PATENT DOCUMENTS

| | | |
|---|---|---|
| WO | WO 02/17039 A2 | 2/2002 |
| WO | WO 02/23676 A1 | 3/2002 |

OTHER PUBLICATIONS

U.S. Appl. No. 10/377,189, filed Feb. 28, 2003, entitled "Industrial Ethernet Switch", 27 pages of text and 11 pages of drawings.

U.S. Appl. No. 10/377,066, filed Feb. 28, 2003, entitled "Ethernet Switch With Configurable Alarms", 37 pages of text and 10 pages of drawings.

The Patent Office of the People's Republic of China.; Examiner's Third Office Action on Patent Application No. 200480005110.1; 12 pages; translation provided, Dec. 26, 2008.

Canadian Intellectual Property Office, Office Action for Application No. 2,473,151, Office Action dated Apr. 28, 2009, received Oct. 5, 2009, 3 pages.

The Patent Office of the People's Republic of China; Examiner's Rejection Decision on Patent Application No. 200480005110.1 transmitted to Baker Botts L.L.P. on May 31, 2010; 8 pages; translation provided.

* cited by examiner

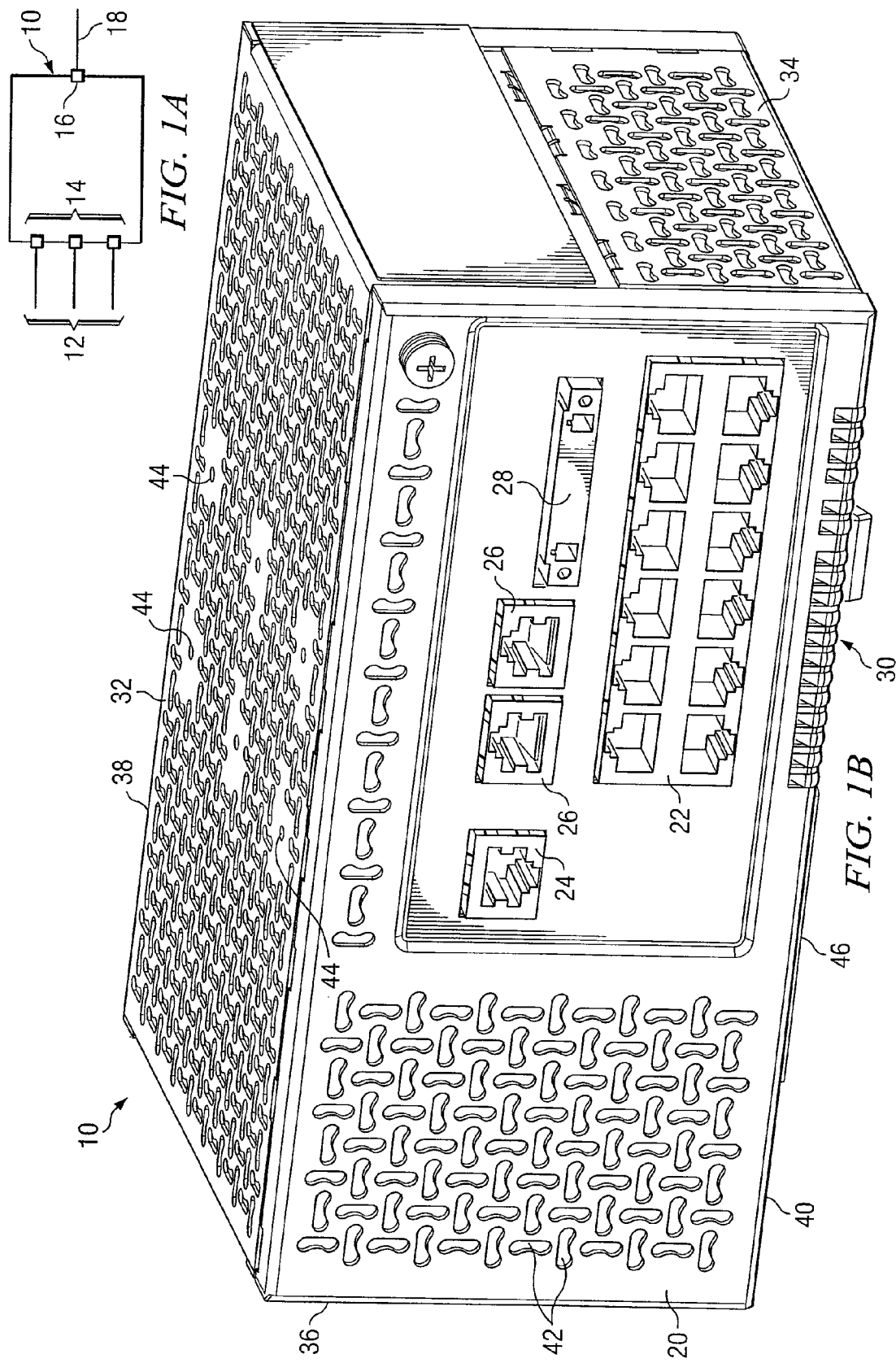

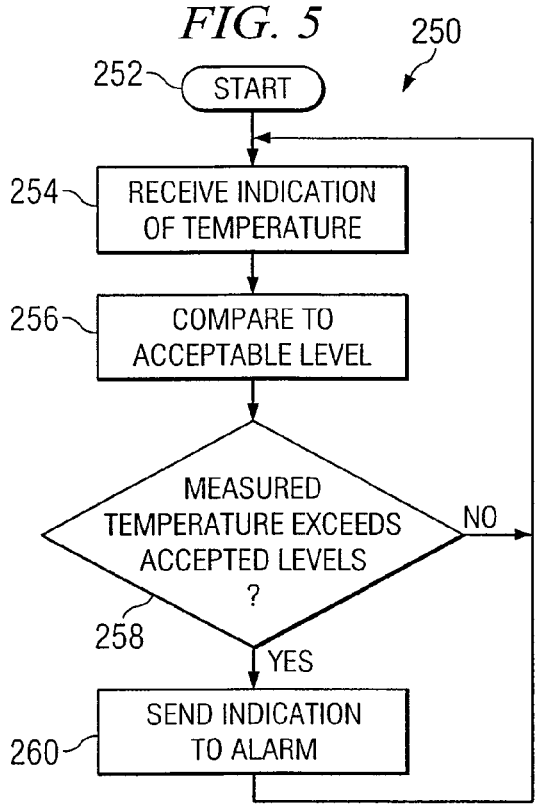
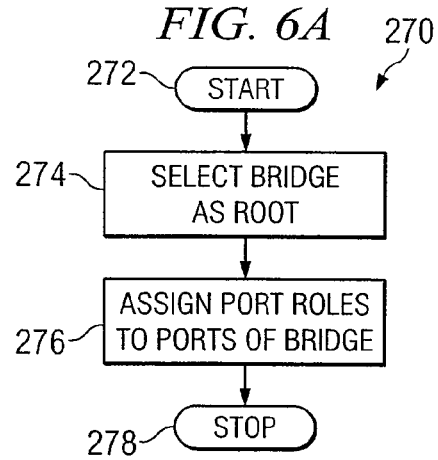
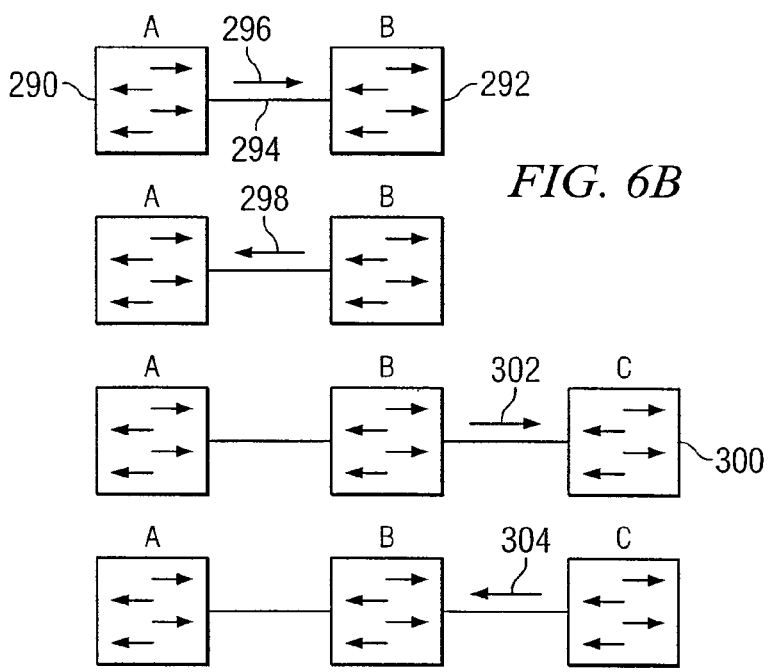

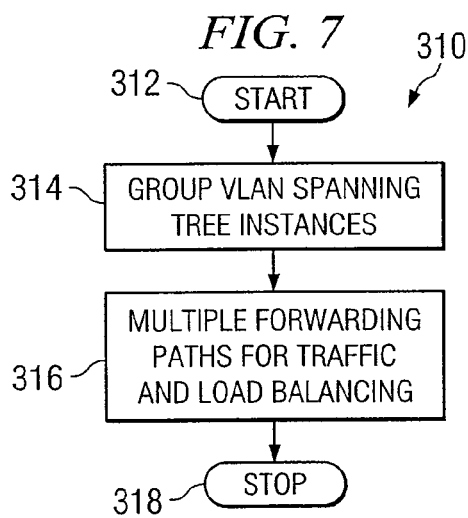
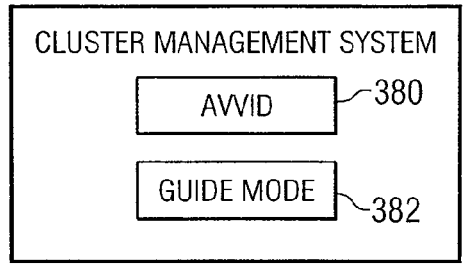
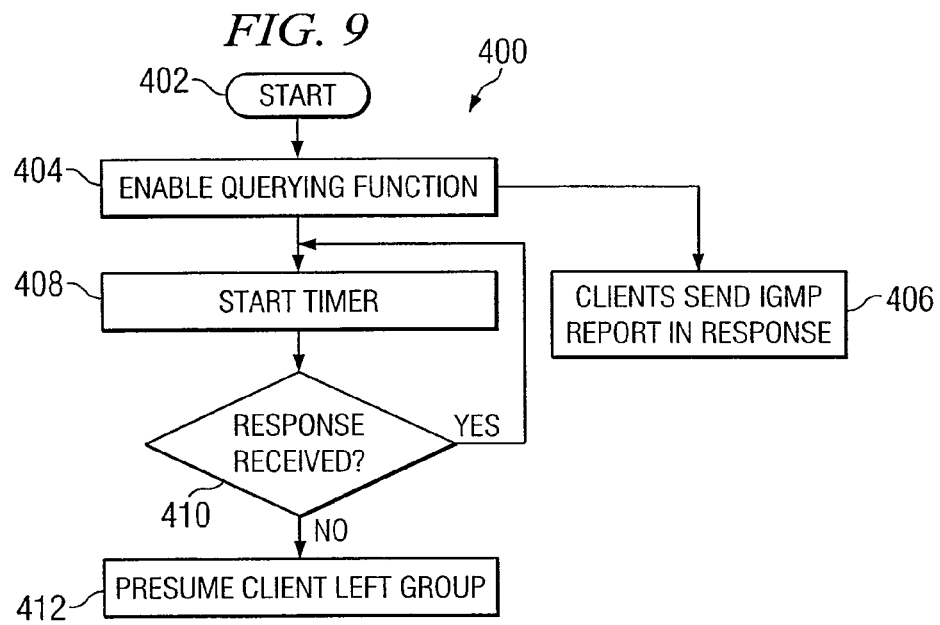

INDUSTRIAL ETHERNET SWITCH

CROSS-REFERENCE TO RELATED APPLICATION

This application is a continuation of U.S. application Ser. No. 10/377,570 filed Feb. 28, 2003 and entitled "Industrial-Ethernet Switch".

TECHNICAL FIELD OF THE INVENTION

This invention relates generally to communications and more particularly to an industrial Ethernet switch with enhanced functionality.

BACKGROUND OF THE INVENTION

Ethernet is a standard for communicating both data and voice signals. The use of Ethernet communications in industrial applications is increasing, and in response, Ethernet switches particularly designed for industrial applications are being produced. Previous implementations of Ethernet in industrial applications, such as manufacturing control applications, have relied on simple unmanaged switched that have been "hardened" to withstand the environmental conditions existing on the manufacturing floor or on intelligent managed switches inside temperature controlled enclosures. Unmanaged switches that do not support intelligent features cannot provide the data transport reliability required by large scale applications specifically for control protocols based on producer-consumer models. Commercial off-the-shelf equipment do not generally meet the form factor and power requirements of the industry at large and its implementation is costly.

SUMMARY OF THE INVENTION

According to one embodiment of the invention a rugged Ethernet switch includes a housing and a passive cooling system associated with the housing and being devoid of fans operable to cool the Ethernet switch. The Ethernet switch also includes software operable to perform at least one of the functions selected from the group consisting of multiple spanning, rapid spanning, cluster management and IGMP snooping and querying.

According to another embodiment, a rugged Ethernet switch includes a housing having a plurality of perforations formed therein for cooling the Ethernet switch. The switch also includes a passive cooling system be devoid of fans and that is operable to cool the Ethernet switch. A temperature sensor operable to measure a temperature of the Ethernet switch is included as is alarm software responsive to the temperature sensor and operable to initiate an alarm when a measured temperature of the Ethernet switch exceeds a particular limit.

Embodiments of the invention may provide numerous technical advantages. Some embodiments may include some, none, or all of the below described advantages. For example, in one embodiment of the invention a rugged Ethernet switch is provided that includes a plurality of advanced software features such as rapid spanning, multiple spanning, cluster management, and IGMP snooping and querying that provides desired functionality to a user of an Ethernet switch, but is believed to not have been implemented in rugged Ethernet switches previously. According to another embodiment, a temperature sensor and alarm software responsive to the temperature sensor are provided in conjunction with an Ethernet switch to monitor a temperature of the Ethernet switch, which allows user intervention in the case of overheating that might result from placing increased functionality on an Ethernet switch.

Other advantages are readily to one skilled in the art.

BRIEF DESCRIPTION OF THE DRAWINGS

Reference is now made to the following description taken in conjunction with the accompanying drawings, wherein like reference numbers represent like parts, in which:

FIG. 1A is a block diagram illustrating an Ethernet switch according to the teachings of the invention;

FIG. 1B is a schematic diagram illustrating a front view of the Ethernet switch of FIG. 1A;

FIG. 5 is a flowchart illustrating a method for monitoring the temperature of the Ethernet switch of FIG. 1B;

FIG. 6A is a flowchart showing a rapid spanning procedure performed by a portion of the Ethernet switch of FIG. 4;

FIG. 6B is a chart illustrating a result of the method of FIG. 6A;

FIG. 7 is a flowchart illustrating multiple spanning performed by a portion of the Ethernet switch of FIG. 4;

FIG. 8 is a block diagram of the cluster management system of FIG. 4; and

FIG. 9 is a flowchart illustrating a method for performing IGMP snooping by a portion of the Ethernet switch of FIG. 4.

DETAILED DESCRIPTION OF EXAMPLE EMBODIMENTS OF THE INVENTION

Figure 1C:
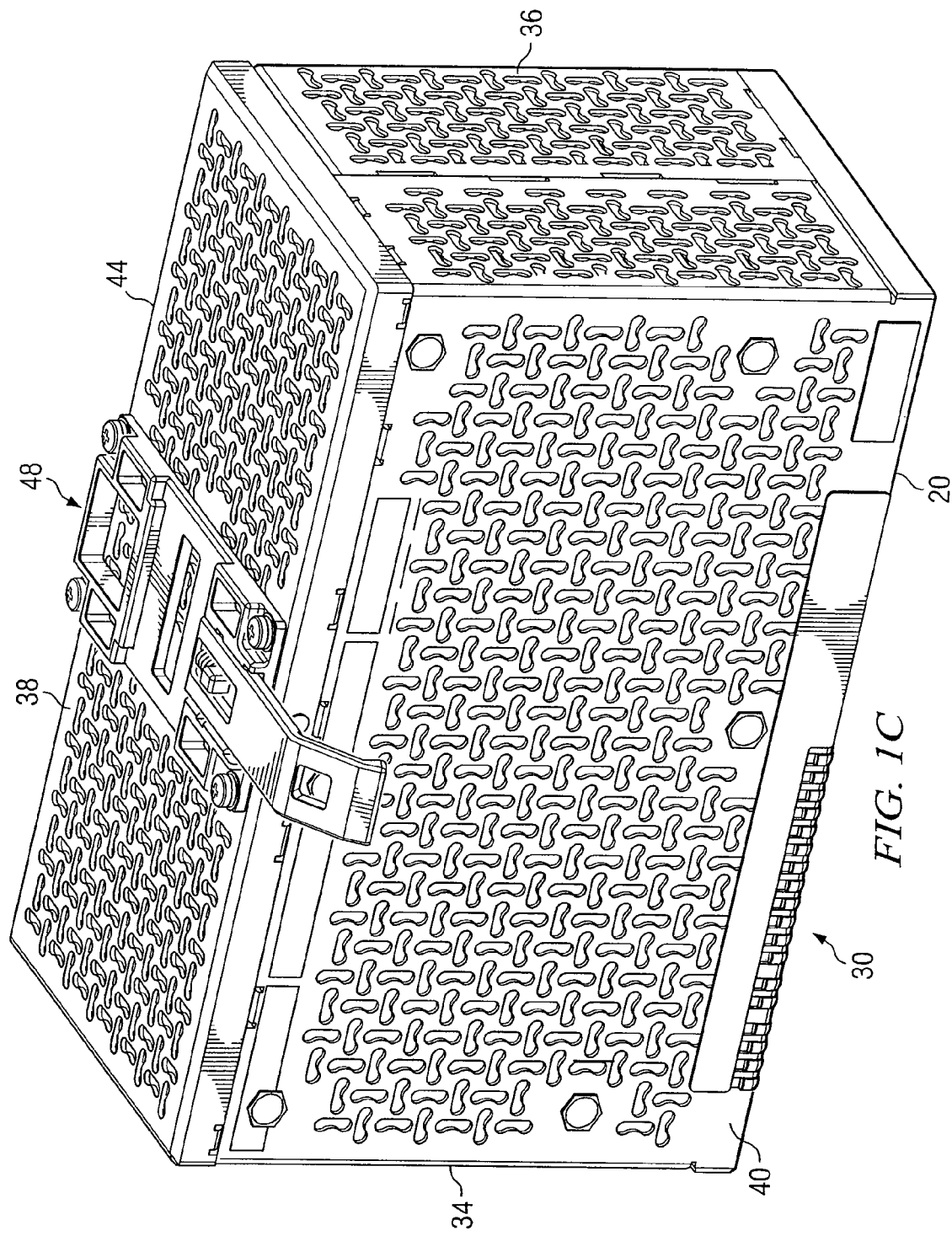
FIG. 1C is a schematic diagram illustrating a bottom view of the Ethernet switch of FIG. 1A.

Embodiments of the invention are best understood by referring to FIGS. 1 through 9 of the drawings, like numerals being used for like and corresponding parts of the various drawings.

FIG. 1A is a block diagram illustrating an Ethernet switch 10 according to the teachings of the invention. Ethernet switch 10 receives a plurality of lines 12 at respective ports 14. Ethernet switch 10 may selectively couple, or switch, each line 12 to another line 12 or to an uplink 18 through output ports 16. Ethernet switches may be used in a variety of contexts to communicate voice and data to a desired location and may be located in a variety of locations, such as within a central office of a telecommunications carrier or within a manufacturing or industrial environment.

FIG. 1B illustrates an isometric drawing of Ethernet switch 10 according to the teachings of the invention. In this view the front 20 of Ethernet switch is illustrated. Shown on front 20 of Ethernet switch 10 are a plurality of RJ connectors, or ports, 22, a console port 24, two RJ uplink ports 26, a power connector 28, and a plurality of light pipes 30. Ethernet switch 10 also has a top side 32, a right side 34, a left side 36, a back side 38, and a bottom side 40. An edge 46 is formed by front side 20 and bottom side 40.

Formed on the various sides of Ethernet switch 10 are a plurality of apertures 42 for allowing cooling of Ethernet switch 10. Formed on top side 38 are a plurality of mounting holes 44 for mounting a mounting clip (not explicitly shown in FIG. 1B) for facilitating mounting of Ethernet switch 10 to DIN rails during installation in an industrial environment.

RJ ports 22 correspond to ports 14 of FIG. 1A. RJ ports 22 may each accept a RJ compatible line carrying voice or data traffic. Console port 24 allows connection to a console for controlling Ethernet switch 10. Link ports 44 provide a connection to another device, such as a router, connected to Ethernet switch 10. Connector 28 provides a location for providing power to Ethernet switch 10 as well as providing a location for user access to the relay connections.

Light pipes 30 provide an indication of the operation of Ethernet switch 10. Light pipes 30 are provided such that they are visible both when Ethernet switch 10 rests on bottom side 40 as well as when it rests on front side 20 (as shown in FIG. 1C). Thus, when Ethernet switch 10 is installed to rest either on its front side 20 or its bottom side 40, an indication of the operation of Ethernet switch 10 may be provided in either configuration.

FIG. 1C is an isometric drawing of Ethernet switch 10 shown in an alternative orientation. In this orientation, Ethernet switch 10 rests on front side 20. Note that in this configuration, the left and right sides are reversed, as compared to FIG. 1B. Thus, left side 36 is visible in this view. This configuration represents a second installation orientation of Ethernet device 10 with the other likely installation orientation shown in FIG. 1B. Also illustrated in this view is a mounting clip 48, which may be utilized to mount Ethernet switch 10 to DIN rails A plurality of mounting apertures, such as mounting apertures 44, are also formed in back side 38, but are obscured from view by mounting clip 48.

Figure 2A:
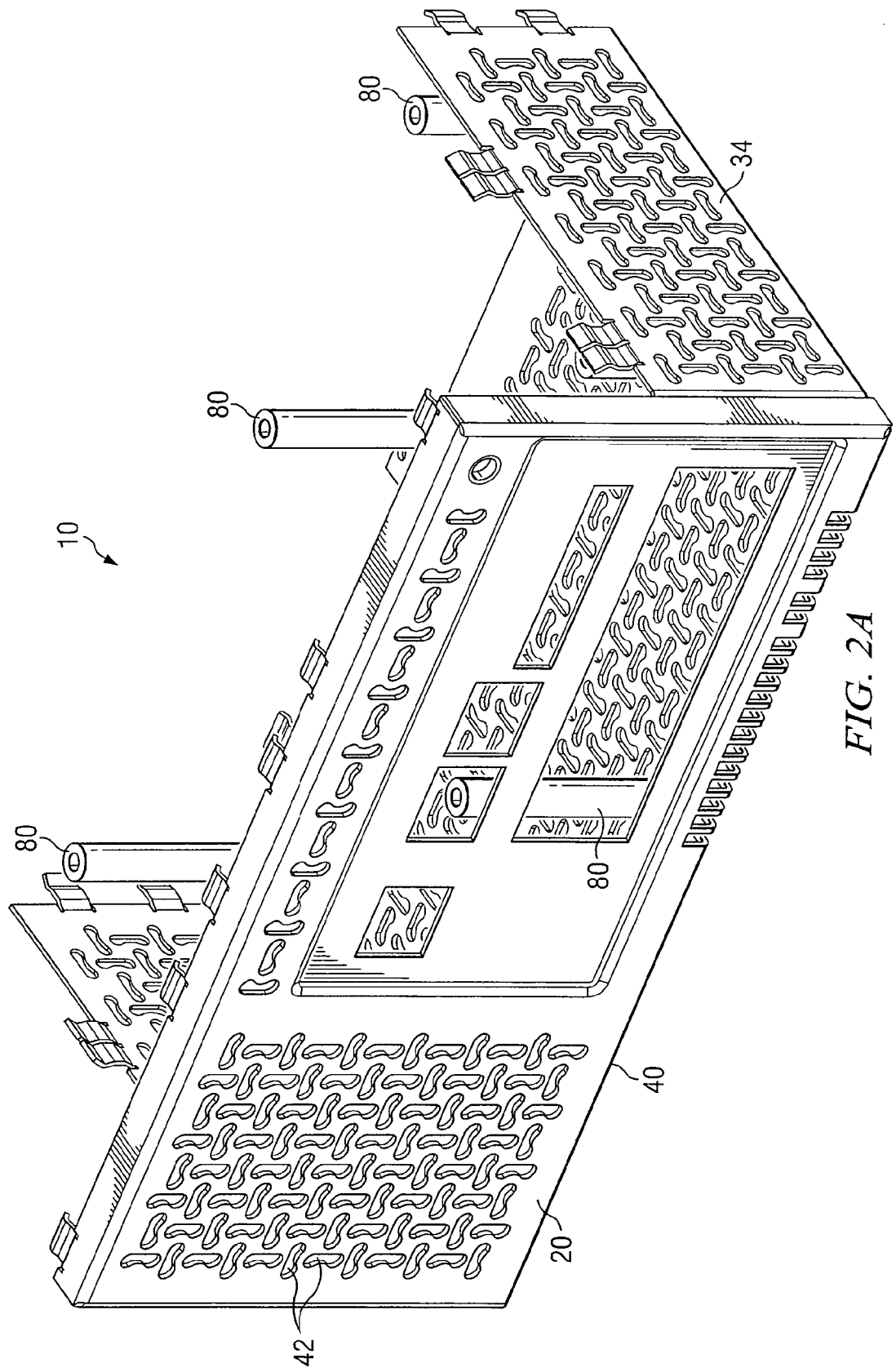
FIG. 2A is an isometric drawing of portions of the interior of the Ethernet switch of FIG. 1B, showing certain elements relate to cooling of the Ethernet switch.

FIG. 2A is an isometric drawing showing portions of Ethernet switch 10 according to the teachings of the invention. In this view, portions of Ethernet switch 10 are deleted so as to render visible spacers 80. Spacers 80 are formed from a generally thermally conductive material, such as aluminum, and operate to both physically support internal cards that perform the main functions of the Ethernet switch as well, as thermally conduct heat from the cards to bottom 40 of the housing of Ethernet switch 10. Thus, heat that is generated by Ethernet switch and transferred to the cards, such as cards 50 or 82 (FIG. 4A) may be conducted to the housing of Ethernet switch 10 for dissipation to the atmosphere. This is one cooling approach utilized. Other approaches are described in greater detail below in conjunction with FIGS. 2B through 3B.

As illustrated, the housing of Ethernet switch 10 is formed with a plurality of apertures 42. Apertures 42 are designed to maximize the surface area of the apertures along the housing of Ethernet switch 10 to allow for heat transfer to the outside atmosphere but at the same time meet electromagnetic emission requirements.

Figure 2B:
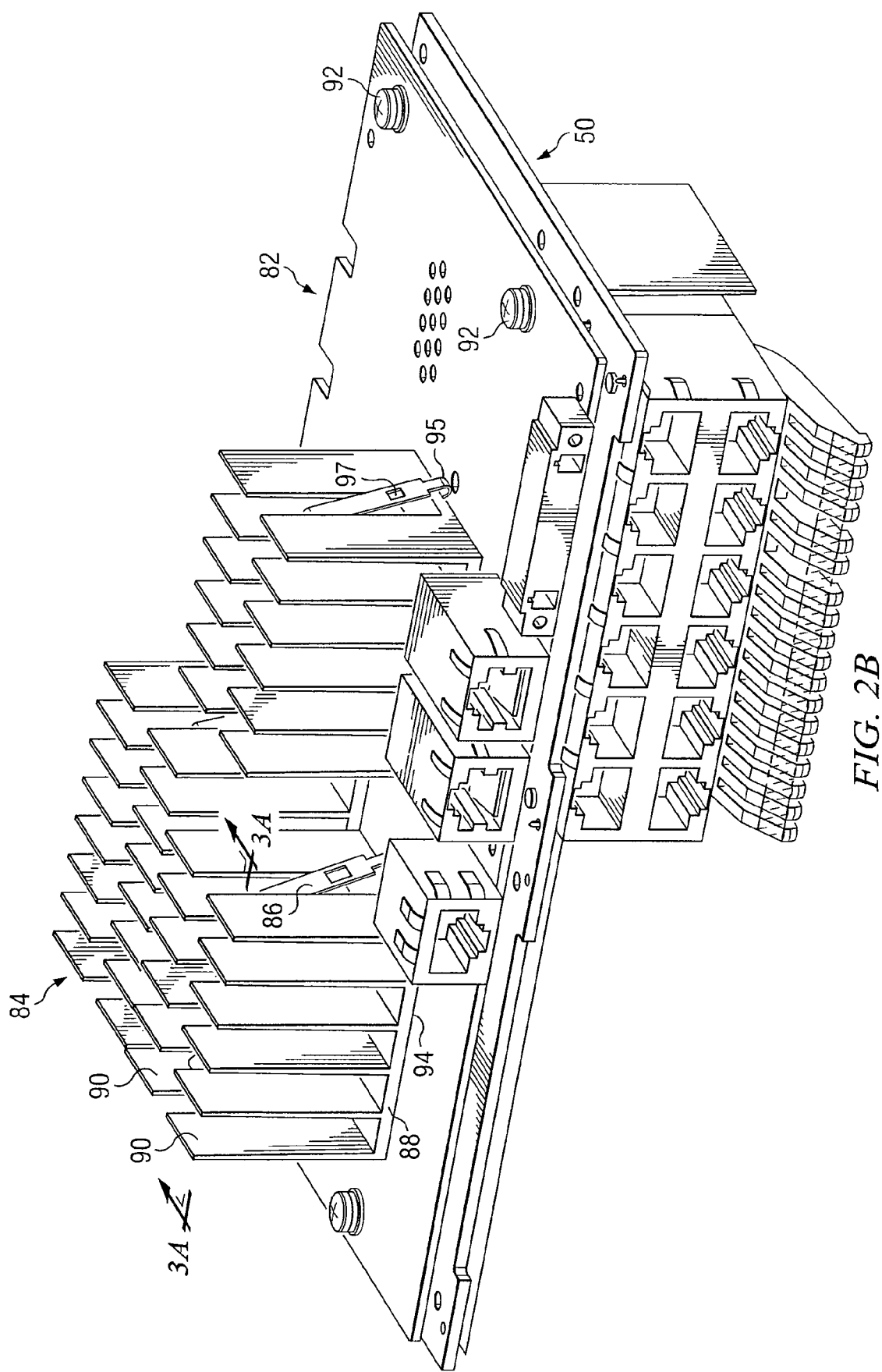
FIG. 2B is an isometric drawing showing two cards that are included within the Ethernet switch of FIG. 1B and associated claim elements.

FIG. 2B is an isometric drawing showing cards 50 and 82 as they would appear positioned within housing of Ethernet switch 10. Card 50 is a PHY card, described above, which includes a plurality of ports and light pipes for indicating the status of the ports or other operations within Ethernet switch 10, as described above. Card 82 houses the CPU for control, an ethernet switch and two alarm relays for external signaling. Disposed on both card 82 and card 50 (see FIG. 2D) are various cooling devices for dissipating heat generated by Ethernet switch 10. As described above, because of the environment in which industrial Ethernet switches are often utilized, passive cooling is required, and thus no convection fans are allowed. This restraint creates challenges for the designer in terms of heat dissipation.

Also illustrated in FIG. 2B are a plurality of heat sinks 84 disposed overlying card 82. Heat sinks 84 are coupled to card 82 through a plurality of elastic clips 86. Elastic clips 86 are shown best in FIG. 3A. Heat sinks 84 are formed with a base portion 88 and a fin portion 90. Disposed between base portion 88 and card 82 (or component on card 82) is a phase change material that changes from a solid to a fluid as it is heated. By changing from a solid to a fluid, voids between the contact of the base portion 88 of heat sinks 84 and card 82, or components overlying card 82, are filled creating a better path for the heat to be conducted across the component/heat sink interface. In one example, the thermal interface material is Thermagon HP105, which changes from solid to liquid phases at approximately 60-65 degrees C. However, other interface materials that change phase from solid to liquid may be used.

Figure 3A:
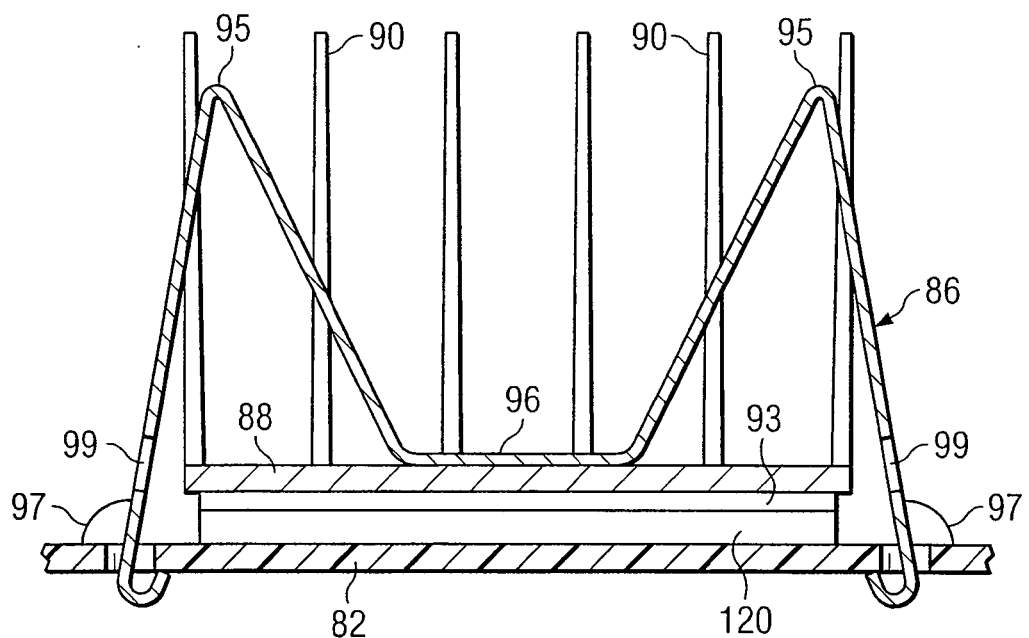
FIGS. 3A and 3B are elevation drawings showing details of clips used to secure heat sinks according to the teachings of the invention.
Figure 3B:
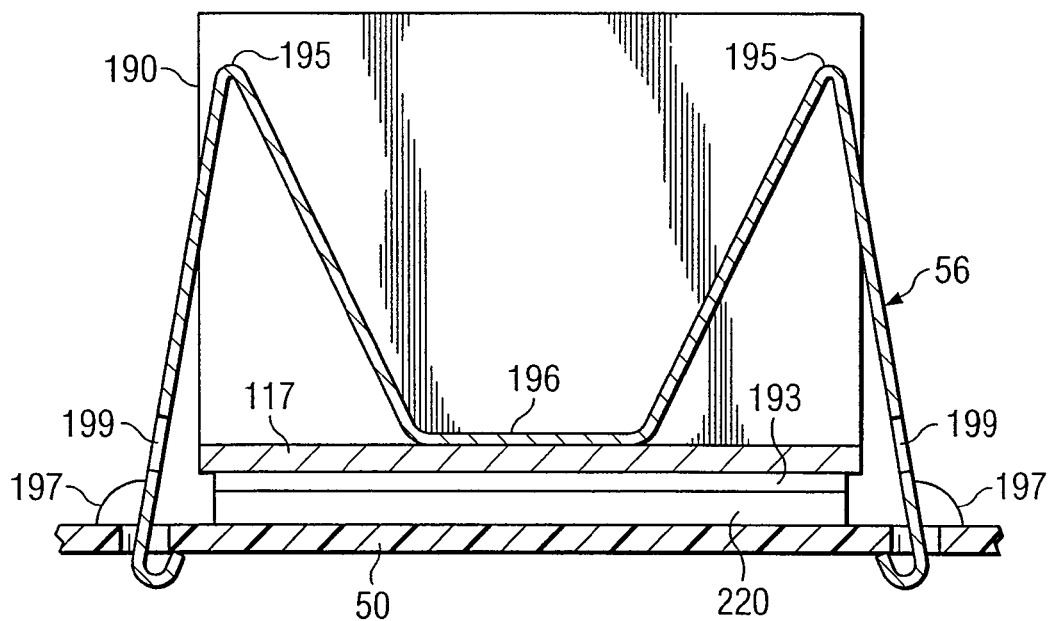

Elastic clips 82 operate to provide an elastic force on base 90 of heat sinks 84 (better illustrated in FIGS. 3A AND 3B). Clips 86 work in conjunction with the phase change material 94 to provide a more conductive path for heat to transfer from components on card 82 to the atmosphere. By providing an elastic force against base 88, clips 86 reduce any space created as the thermal interface material 94 goes through a phase change. Thus, a good thermal contact is maintained between components to be cooled and heat sinks 84. If a conventional fastener were used to connect heat sinks 84 to the components on card 82, the conventional fastener, such as screw, would not necessarily maintain good contact between heat sinks 84 and component overlying card 82 as the thermal interface material changes phase. This is because a pin would not provide sufficient pressure when interface material goes through a phase change.

According to one embodiment, heat sinks 84 are formed from a relatively lightweight material, such as aluminum. However, other materials may be used. The use of a lightweight material both allows better cooling, due to reduced thermal mass and therefore the reduced time to heat fins 90, as well as providing lower inertia, which produces desirable vibration characteristics. The lighter weight heat sinks 84 reach thermal equilibrium quicker than more robust sinks and hence radiate and transfer the heat from the component more rapidly. This maintains a cooler component.

In general, heat generated on a component under heat sinks 84 is conducted through phase change material 94 to base 88 of heat sinks 84. The heat then conducts to fins 90 where, in the illustrated orientation, the predominant heat transfer mechanism is radiation, and fins 90 radiate heat toward housing of Ethernet switch 10. When disposed in a vertical orientation, the predominant heat transfer mechanism is free convection, also known as a chimney effect, and heat transfer occurs through the slow movement of air over fins 90, taking the heat to the housing of Ethernet switch 10.

As described above, spacers 80 (FIG. 2A) support cards 82 and 50 through fasteners 50 and also provide conduction directly from card 82 and 50 to the bottom 40 of Ethernet switch 10. This provides additional heat transfer directly from the cards to the housing of Ethernet switch 10.

Figure 2C:
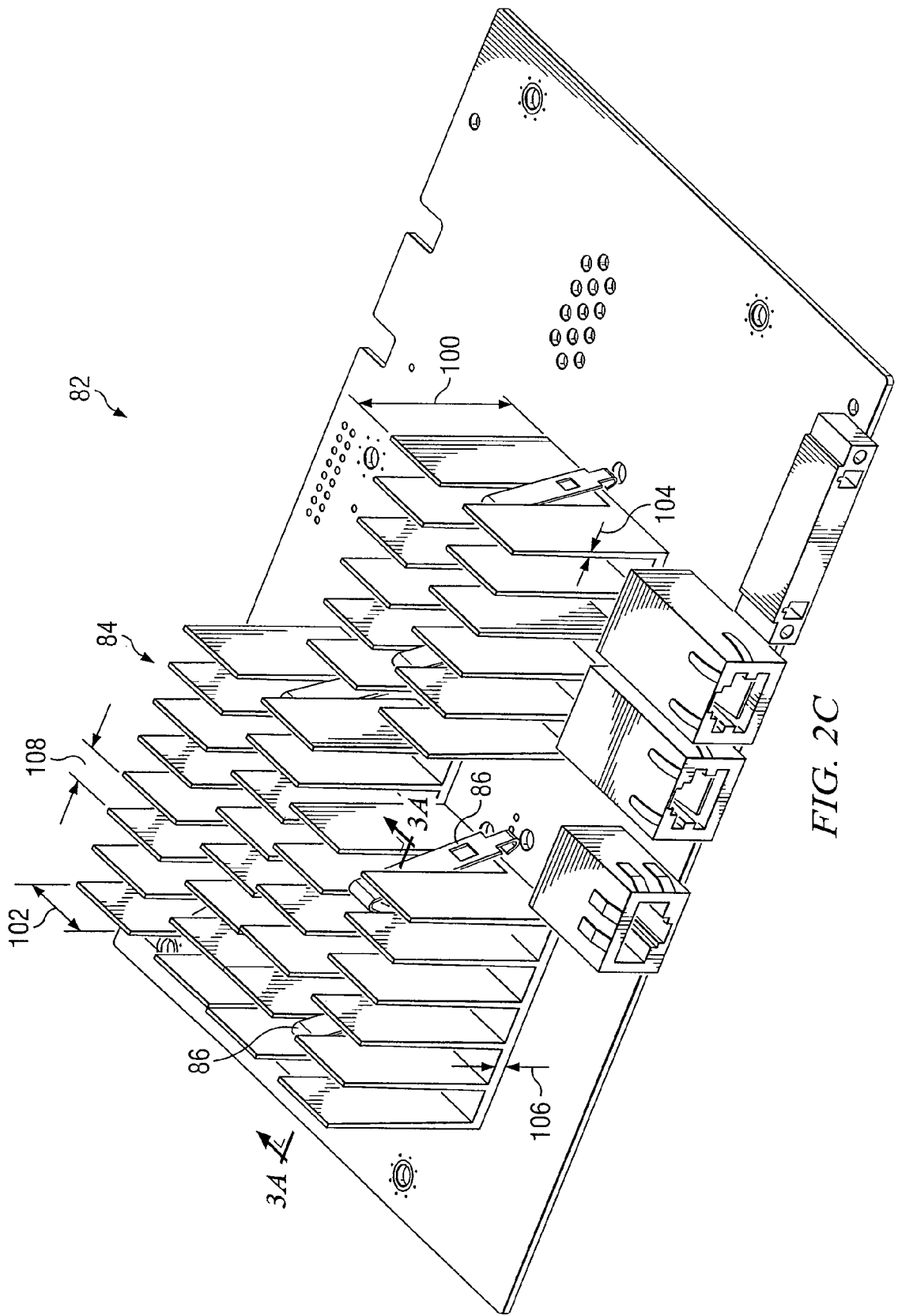
FIG. 2C is an isometric drawing showing a CPU card with copper uplink card of FIG. 2B.

FIG. 2C shows more clearly card 82. Although any suitable orientation of heat sinks 84 may be utilized, a particular configuration is described in detail below. In this configuration, each of the fins 90 of the heat sinks 84 has a height of approximately 1.4 inches, as indicated by reference numeral 100. Fins 84 also have an approximate width of 0.60 inches as indicated by reference numeral 102, and are formed with a thickness of approximately 0.03 inches, as indicated by reference numeral 104. Base 88 is formed with a thickness of approximately 0.9 inches, as indicated by reference numeral 106. The various fins within a given heat sink are spaced apart approximately 0.3 inches as indicated by reference numeral 108. As illustrated some of the heat sinks are formed in groups having six fins and some are formed in groups having eight fins; however, other configurations and numbers of fins may be utilized according to desired heat transfer requirements and card layout. In this embodiment, a lesser number of fins is utilized to accommodate additional components on card 82b.

Figure 2D:
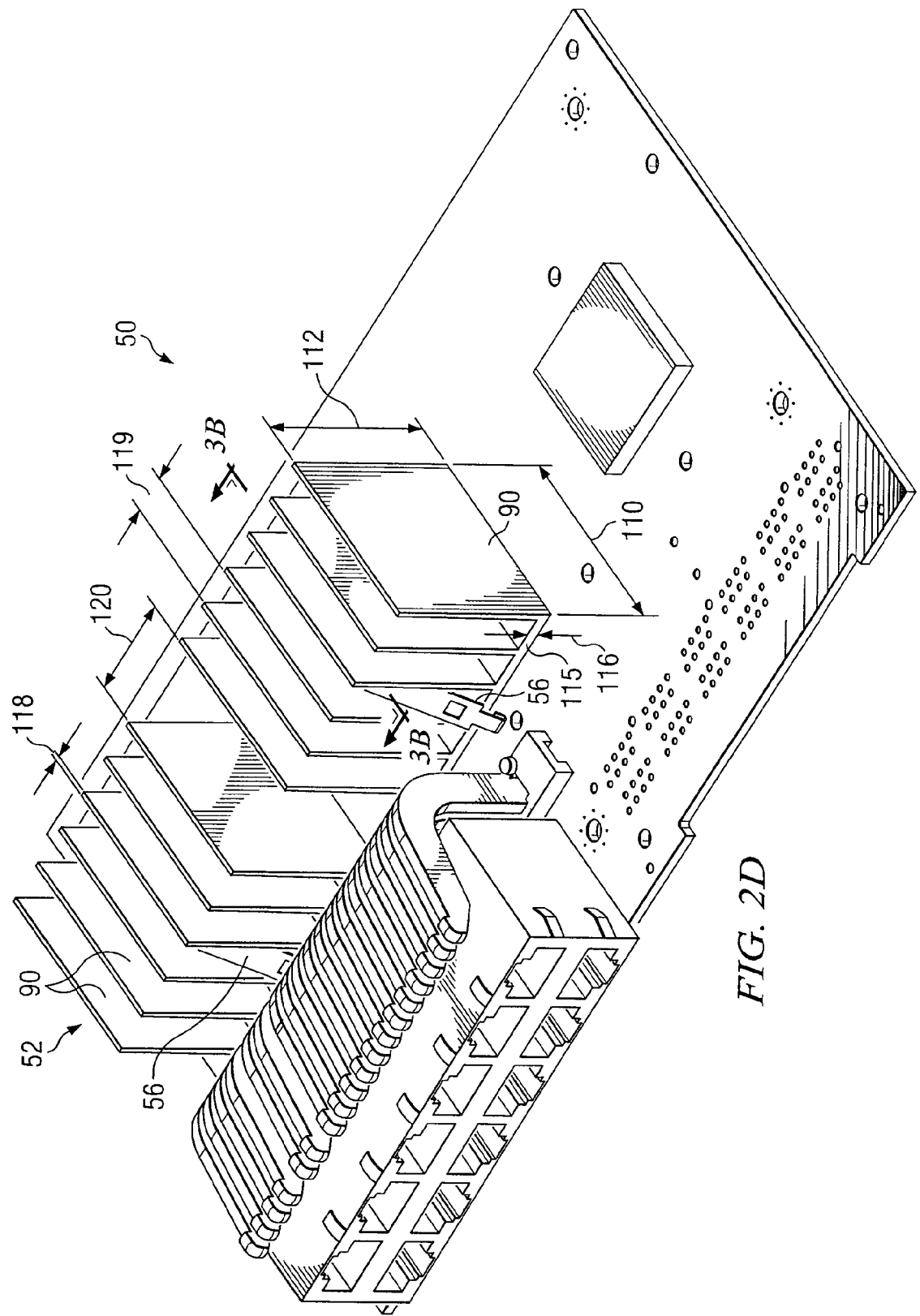
FIG. 2D is an isometric drawing showing the PHY card of FIG. 2B.

FIG. 2D shows a bottom view of card 50. As illustrated, card 50 includes a plurality of heat sinks 52 attached to card 50 via clips 56. Heat sinks 52 are substantially similar to heat sinks 84, except they are oriented differently and have different dimensions. In this particular embodiment, fins 90 have a length of 1.5 inches, as designed by reference numeral 110 and a height of 1.31 inches as designated by reference numeral 112. Fins 90 are formed with a thickness of 0.030 inches as designated by reference numeral 118 and base 115 is formed with a thickness of 0.090 inches as designated by reference numeral 116. In this embodiment, fins 90 are spaced apart by a distance of 0.304 inches, as designated by reference numeral 119 with an irregular spacing of 0.75 inches, as designated by reference numeral 120 to accommodate the board layout. In this embodiment, clip 56, which is substantially similar to clip 86, depresses against base 115 of heat sinks 52 between fins 90. This contrasts with card 82 in which clips 86 depress against base 88 between rows of fins 90.

In addition to the illustrated heat transfer mechanisms, thermal vias may be formed within cards 50 and 82 to further allow heat transfer within Ethernet switch 10.

FIGS. 3A and 3B are partial elevational views of FIGS. 2B and 2D, respectively, along the indicated lines, showing clips 86 and 56. In FIG. 3A, clip 86 is illustrated as having a shape in the general configuration of an M with two side portions 95 and a middle portion 96. On the ends of side portions 95 are hooks 97 for coupling clip 86 to card 82. Clips 86 may also be formed with holes 99 for receiving a tool for attaching clips 86 to card 82. As illustrated, middle portion 96 overlies a base 88 of heat sinks 84. Below base 88 is a phase change material 93, described above, which fills voids between base 88 and a component 120 overlying card 82. Clip 56 of FIG. 3B is analogous to clip 86 except that it is disposed between two fins 90 of heat sinks 90, rather than a cut across the heat sink fins.

As described above, Ethernet switch 10 is a rugged, hardened, switch designed for industrial applications. Although Ethernet switch 10 is designed for industrial applications, in contrast to conventional devices, Ethernet switch 10 implements a plurality of advanced features, some of which are not conventionally seen in rugged Ethernet switches. In general, and as described in greater detail below, Ethernet switch 10 implements, in one embodiment, spanning tree protocol (STP) according to IEEE 802.1d, multiple STP according IEEE 802.1s, rapid STP according to IEEE 802.1w, VLAN, dynamic access ports, VLAN query protocol, VLAN membership policy server, dynamic trunk protocol, secure ports, port aggregation protocol, port security MAC aging, IGMP filter, SPAN, RSPAN, protected ports, storm control, IEEE 802.1x Support, IEEE 802.1p, Auto QoS, IEEE 802.1q trunking protocol, network time protocol, access control list L2-L4s time-based ACL, DHCP Option 82, Cluster Management Suite, Cisco intelligence engine 2100, Cisco networking services, Simple Network Management Protocol, remote monitoring, and system crash information. Additional details regarding the functionality of Ethernet switch 10 are described in greater detail below in conjunction with FIG. 4.

Figure 4:
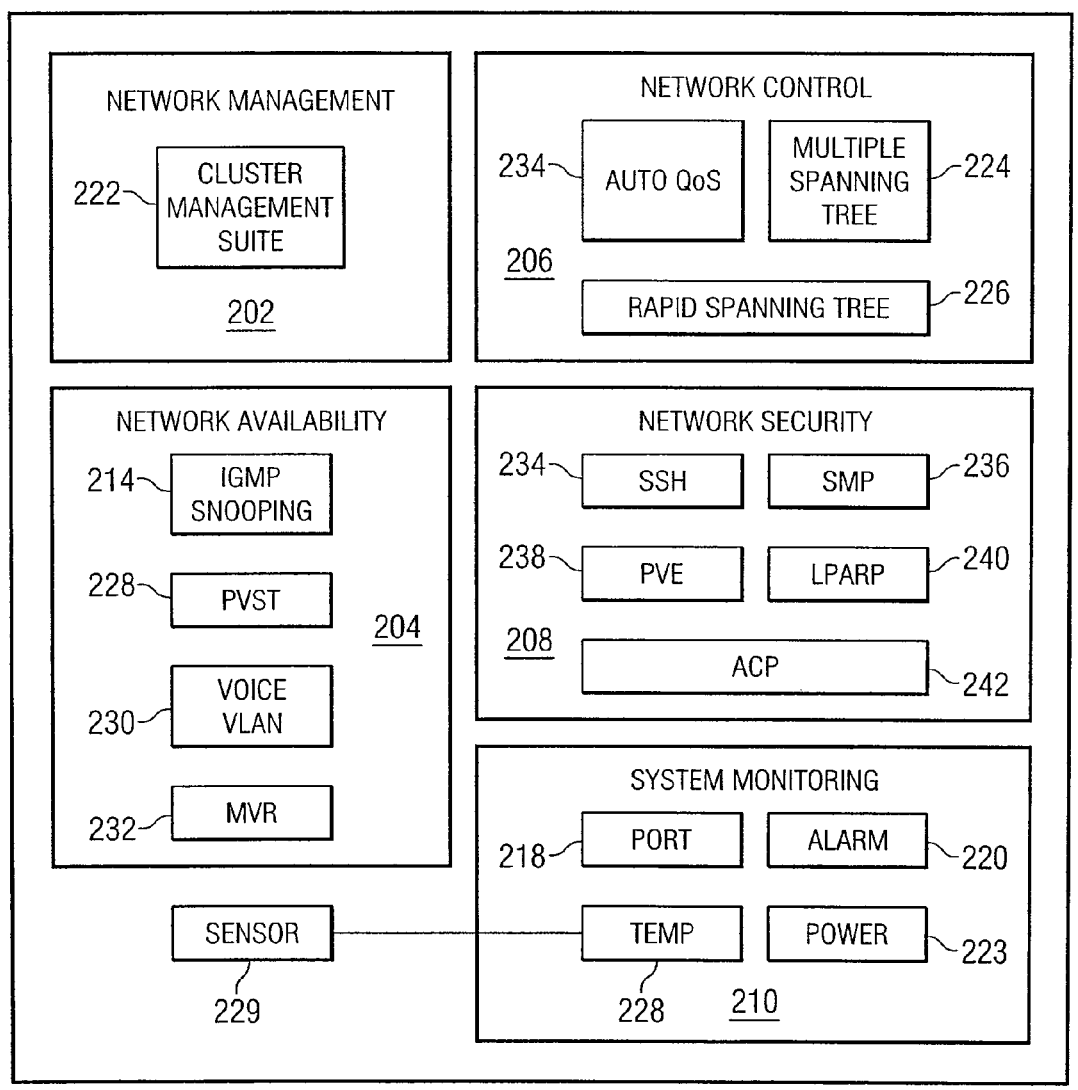
FIG. 4 is a functional block diagram of the Ethernet switch of FIG. 1B.

FIG. 4 is a functional block diagram of Ethernet switch 10, showing various functional groups of Ethernet switch 10. In one embodiment functions corresponding to these groups are programmed in software and stored on a computer readable media, which is executable by a processor of Ethernet switch 10. In other embodiments these functions may be programmed in firmware. The functions of Ethernet switch 10 may generally be grouped into the following categories: network management 202, network availability 204, network control 206, network security 208, and system monitoring 210.

Network management block 202 refers to management functions associated with the network on which Ethernet switch 10 operates. A major portion of network management block 202 comprises cluster management suite 222. In one embodiment, cluster management suite 222 comprises a Cisco Customer Management Suite, available from Cisco Systems, Inc. Cluster management suite 222 generally allows users to manage a plurality of Ethernet switches 10 from a remote device. In one embodiment, up to sixteen switches may be managed through any standard web browser through use of cluster management system 222 regardless of their geographical proximity to each other. In one embodiment, a single IP address may be utilized for an entire cluster of Ethernet switches if desired. Cluster management system 222 provides, in one embodiment, an integrated management interface for delivering intelligent services, which may include multi-layer switching, QoS, multicast, and security access control lists. Thus cluster management system, in one embodiment, allows administrators to take advantage of advance benefits without having to learn the command-line interface, or even details of the underlying technology. Cluster management system 222 allows a network administrator to designate a standby or redundant command switch, which takes the commander duties should the primary command switch fail. Other features of cluster management system 222 include the ability to configure multiple ports and switches simultaneously, as well as perform software updates across each cluster at once, and clone configurations to other clustered switches for rapid network deployment. Bandwidth graphs may be generated by cluster management system 222 as well as link reports, which provide useful diagnostic information and the topology map gives network administrators a quick view of the network status.

In addition to cluster management system 222 network management block 202 may include functionality such as provided by CiscoWorks for Switched Internetworks. The switch cluster management unit 222 may utilize the hot standby router protocol (HSRP) or supporting command switch redundancy.

Network availability block 204 provides functionality associated with maintaining efficient use of resources for bandwidth-hungry applications, such as multicast. In a particular embodiment, an IGMP snooping feature 214 is provided that allows switch 10 to "listen in" on the Internet Group Management Protocol (IGMP) conversation between hosts and routers. When a switch hears an IGMP joined requests from a host for a given multicast group, the switch adds the host's support number to the group destination address (GDA) list for that group and when the switch hears an IGMP leave request, it removes the host port from the content addressable memory table entry.

A PVST block 228 refers to Per VLAN Spanning Tree and allows users to implement redundant uplinks while also distributing traffic loads across multiple links. Additional functionality that enhances performance is voice VLAN 230. This feature allows network administrators to assign voice traffic to a VLAN dedicated to IP telephony, which simplifies phone installations and provides easier network traffic administration and troubleshooting. A multicast VLAN registration block 232 is provided for applications that deploy multicast traffic across an Ethernet network. For example, the multicast VLAN contains the broadcasts of single or multiple video streams over the network. MVR block 232 allows a subscriber on a port to subscribe and unsubscribe to a multicast stream on the network-wide multicast VLAN.

Network control block 206 provides functionality for classifying, prioritizing and avoiding congestion in network traffic. To do this, network control block 206 may include an auto QoS block 234, which detects IP phones or other type of hosts requiring special quality of service features and automatically configures the switch for the appropriate classification and egress queuing. This optimizes traffic prioritization in network availability without the challenge of a complex configuration. Network control block 206 is operable to classify, reclassify, police, and mark or drop the incoming packets before the packet is placed into the shared buffer. Packet classification allows the network elements to discriminate between various traffic flows in enforced policies based on layer 2 and layer 3 QoS field. To implement QoS, network control block 206 first identifies traffic flows, or packet groups, and classifies or reclassifies these groups using the DSCP field in the IP packet and/or the 802.1P class of service (CoS) field in the Ethernet packet. Classification and reclassification can also be based on criteria as specific as the source/destination IP address, source/destination MAC address, or the layer for TCP/UDP ports. At the ingress level, network control 206 also performs policing and marking of the packet.

After the packet goes through classification, policing, and marking, it is then assigned to the appropriate queue before exiting the switch. In one embodiment, four egress queues per port are supported, which allows the network administrator to be more discriminating and specific in assigning priorities for the various applications on the LAN. At the egress level, the network control block 206 performs scheduling, which is a process that determines the order in which the queues are processed. Weighted round-robin scheduling, strict priority scheduling, or other scheduling approaches may be utilized. The weighted round-robin scheduling algorithm assures that lower priority packets are not entirely starved for bandwidth and are serviced without compromising the priority settings administered by the network manager. Strict priority scheduling ensures that the highest priority packets will always get serviced first out of all other traffic, and that the three queues will be serviced using weighted round-robin best effort.

Thus network control 206 allows network administrators to prioritize missions having critical and/or bandwidth-intensive traffic over less time-sensitive applications such as FTP or e-mail. For example, it would be highly undesirable to have a large file download destined to one port or a wiring closet switch and have quality implications such as increased latency in voice or control traffic, destined to another port on this switch. This condition is weighed by ensuring that latency sensitive or critical traffic is properly classified and prioritized throughout the network. Other applications, such as web browsing, can be treated as low priority and handled on a best-effort basis.

Network control block 206 is operable to allocate bandwidth based on several criteria including MAC source address, MAC destination address, IP source address, IP destination address, and TCP/UDP port number. Bandwidth allocation is essential in network environments requiring service-level agreements or when it is necessary for the network manager to control the bandwidth given to certain users.

Also provided within network control block 206 is a multiple spanning tree block 224 and a rapid spanning tree block 226. In general, multiple spanning tree block 224 implements multiple spanning tree protocol (MSTP) according to IEEE 802.1s, which groups VLANs into a spanning tree instance and provides for multiple forwarding paths for data traffic and load balancing. Rapid spanning tree block 226 implements rapid spanning tree protocol (RSTP) according to IEEE 802.1w for providing rapid conversions of the spanning tree by immediately transitioning route and designated ports to the forwarding state. Multiple spanning tree block 224 and rapid spanning tree block 226 are described in greater detail below in conjunction with FIGS. 6A, 6B, and 7.

Network security block 208 provides functionality associated with network security. In one embodiment, network security block 208 offers enhanced data security through a wide range of security features. Such features allow customers to enhance LAN security with capabilities to secure network management traffic through the protection of passwords and configuration information; to provide options for network security based on users, ports, and MAC addresses; and to enable more immediate reactions to intruder and hacker detection. An SSH block 234, standing for secure shell, and a SNMP block 236, standing for simple network management protocol version 3, protect information from being tampered with or eavesdropped by encrypting information being passed along the network, thereby guarding administrative information. A private VLAN edge block 238 isolates ports on a switch, insuring that traffic travels directly from the entry port to the aggregation device through a virtual path and cannot be directed to another port. A local proxy address resolution protocol (LPARP) block 240 works in conjunction with private VLAN edge 238 to minimize broadcasts and maximize available bandwidth. A plurality of port-based access control parameters 242 restrict sensitive portions of the network by denying packets based on source and destination MAC addresses, IP addresses, or TCP/UDP ports. In one embodiment, access control parameters 242 lookups are performed in hardware; therefore, forwarding performance is not compromised when implementing this type of security in the network. In addition, time-based ACLs, standing for Access Control Lists allow configuration of differentiated services based on time periods. ACLs can be applied to filter traffic based on DSCP values. DSCP stands for Differentiated Services Code Point. Port security provides another means to ensure the appropriate user is on the network by eliminating access based on MAC addresses.

For authentication of users with a Terminal Access Controller Access Control System (TACACS) or RADIUS server, IEEE Spec. 802.1x provides port-level security. IEEE 802.1x in conjunction with a RADIUS server allows for dynamic port-based user authentication. IEEE 802.1x-based user authentication can be extended to dynamically assign a VLAN based on a specific user regardless of where they connect the network. This intelligent adaptability allows IT departments to offer greater flexibility and mobility to their stratified user populations. By combining access control and user profiles with secure network connectivity, services, and applications, enterprises can more effectively manage user mobility and drastically reduce the overhead associated with granting and managing access to network resources.

With network security block 208, network managers can implement a high level of console security. Multi-level access security on the switch console and the web-based management interface prevents unauthorized users from accessing or altering switch configuration TACACS+ or RADIUS authentication enables centralized access control of the switch and restricts unauthorized users from altering the configuration. Deploying security can be performed through Cisco Cluster Management Systems software 222, described above, which ease the deployment of security features that restrict user access to a server, a portion of the network, or access to the network.

Ethernet switch also includes a system monitoring block 210. In general, system monitoring block monitors various aspects of the Ethernet switch 10. In this regard, system monitoring block 210 includes a temperature monitoring block 228, a port monitoring block 218, an alarm block 220, and a power monitoring block 223.

Temperature monitoring block 228 generally monitors a temperature of Ethernet switch 10 and detects temperatures that exceed a determined level. The temperature may be measured by a temperature sensor, such as sensor 229 associated with temperature monitoring block 228. By implementing such a plurality of advanced features on an industrial switch as described above, there is a tendency for the temperature of Ethernet switch 10 to rise above acceptable levels. To combat this tendency, advanced cooling systems are provided. However, if for some reason efficient cooling cannot be effected, an alarm may be provided indicating to a user that Ethernet switch 10 may fail. In response, a user may take appropriate action. Additional details regarding temperature monitoring performed by Ethernet switch 10 are described in greater detail below in conjunction with FIG. 5. Port monitoring block 218 is associated with detecting port error conditions, such as port not forwarding, port not operating, FCS error rate, and link fault errors.

Alarm block 220 comprises one or more alarms responsive to various detected conditions, including an excessive temperature of detections described above. Alarm block 220 may invoke a relay alarm that can be wired to trigger audiovisual alarms such as a sound bell, a light, or other alarm, or alternatively may transmit a signal to an external alarm to inform a user or manager of an alarm condition.

System monitoring block 216 also includes a power monitoring block 223. Power monitoring block 223 monitors the power received by Ethernet switch 10 such that insufficient power levels may be detected and, if necessary, alarms initiated.

FIG. 5 is a flow chart illustrating a method 250 for monitoring a temperature of Ethernet switch 10. As described above, due to the increased functionality provided with Ethernet switch 10 in an industrial environment, the power requirements for providing such functionality result in increased heat generation. Increased heat generation is provided by more intensive computational power to support intelligent Ethernet, as described above; however, in some instances cooling may be insufficient or the environmental temperature where the switch is deployed exceeds the maximum recommended, causing the temperature of Ethernet switch 10 to rise to unacceptable levels. The teachings of the invention recognize that if such occurs, it is desirable to inform a user or operator of Ethernet switch 10 that possible overheating may occur, allowing such a user to take remedial action. One embodiment of such a method is described below; however, other suitable methods may also be implemented.

The method begins at step 252. At step 254 temperature monitoring block 228 receives an indication of a temperature of Ethernet switch 10. Such an indication can be received by temperature sensor 229, such as a thermister, a thermocouple or other temperature sensing device. At step 256 the received indication of temperature is compared to an acceptable level. According to one embodiment, an acceptable level is from –40 degrees Celsius to 65 degrees Celsius. At step 258 a determination is made of whether the measured temperature exceeds an acceptable level. If the measured temperature does exceed an acceptable level, processing continues at block 260 in which an indication of the exceeding of an acceptable level is provided to an alarm. Processing then reverts back to step 254 in which the temperature is continually updated. Appropriate software may be provided such that multiple alarms are not unnecessarily generated. At block 258 if the measured temperature is within acceptable levels processing continues back at step 254. It will be understood that a suitable time interval for checking the temperature level may be designated.

Thus, according to the teachings of the invention, a temperature of Ethernet switch 10 is monitored, and Ethernet switch 10 can generate an alarm when unacceptable levels are reached, allowing remedial action to be taken.

FIG. 6A is a flow chart illustrating functions associated with performing rapid spanning tree protocol (RSTP) according to IEEE standard 802.1w which is incorporated herein by reference. As used herein, the term rapid spanning refers to rapid convergence of a spanning tree according to IEEE 802.1w. Additional details of one example of such rapid spanning may be found in U.S. Pat. No. 6,032,194, assigned to Cisco Systems, which incorporated herein by reference. In one embodiment, the illustrated functions are performed by rapid spanning tree block 226 of network control block 206 of Ethernet switch 10. Method 270 begins at step 272. At step 274 a bridge is selected as a route. At step 276, port roles are assigned to ports of the selected bridge. As well known in IEEE standard 802.1w, port roles may take one of five roles: Root, Designated, Alternate, Backup, and Disabled. Possible port states for each of the roles may include Discarding, Learning, and Forwarding. The method ends at step 278. In general, rapid spanning provides rapid convergence of spanning tree by immediately transitioning roots and designated ports to the forwarding state.

FIG. 6B illustrates this rapid convergence in a simple typology. In general, rapid spanning aims to transition route ports and designated ports to forwarding and alternate, backup ports to the blocking state as rapidly as possible. Transitioning a port to a blocking state can never introduce a loop in the network. However, transitions to a forwarding port state requires the port rolls assigned to other ports in the network to be consistent to prevent loops. Rapid spanning may involve explicit handshaking between the bridges to preserve the consistency and correctness.

A bridge 290 is connected to a bridge 292 through a point to point link 294 and all ports are in a blocking state. Assuming the priority for bridge 290 is less than the priority of bridge 292, bridge 290 sends a proposal message to bridge 292, indicating it wants to be the designated bridge, as indicated by reference numeral 296. Upon receiving the proposal message, bridge 292 compares the priority information in the message and selects the port as its route port. Now bridge 292 ensures that roles and states of other ports are consistent with the information received from bridge 290. Bridge 292 then sends a confirmation 298 to bridge 290 and sets the port state to forwarding immediately. This message is called an agreement message and also indicates that bridge 292's port is assigned a root port role. Upon receiving bridge 292's agreement message 298, bridge 290 also moves its port into forwarding state immediately.

When a third bridge 300 is connected to bridge 292, handshaking messages are exchanged, as indicated by reference numerals 302 and 304. Bridge 300 selects the port connected to bridge 292 as its root port, and both bridges transition to a forwarding state immediately. With each generation of this handshaking process one more bridge will join the active typology. As the network converges, this proposal agreement and handshaking agreement progresses from the root towards the leaves of the spanning tree.

Thus, according to the teachings of the invention, rapid spanning is implemented on a rugged Ethernet switch 10, which heretofore have not benefited from such advanced features.

FIG. 7 is a block diagram illustrating a method 310 for multiple spanning. In general, multiple spanning groups VLANS into a spanning tree instance and provides for multiple forwarding pass for data traffic and load balancing. As used herein, multiple spanning refers to multiple spanning according to IEEE 802.1S, which is incorporated herein by reference. The method begins at step 312. At a step 314, a plurality of VLANS are grouped into spanning tree instances. Each instance may be independent of the other spanning tree instance. At a step 316, multiple forwarding paths or traffic and load balancing are provided. The method concludes at step 318. Thus, multiple spanning allows multiple forwarding paths for data traffic and load balancing. According to the teachings of the invention, a multiple spanning tree protocol is implemented on a rugged Ethernet switch 10, which heretofore have not utilized such advanced programming features.

FIG. 8 is a block diagram showing additional details of cluster management system 222. In general, cluster management system 222 allows configuring multiple Ethernet switches at the same time. As used herein, "cluster management" refers to essentially simultaneous management of multiple Ethernet switches. Thus, configuration, monitoring, authentication and software upgrades of multiple switches may be performed at once. Cluster management system 222, according to one embodiment, also supports automatic discovery of candidate switches and creations of clusters of up to 16 switches that can be managed through a single IP address. In some embodiments cluster management involves managing multiple Ethernet switches through a single IP address.

In one embodiment, cluster management system supports command switch redundancy by using Hot Standby Router Protocol. Cluster management system 222 allows users to simultaneously configure and troubleshoot multiple desktop switches using a standard web browser. In one embodiment, cluster management system includes a Architecture for Voice Video and Integration Module 380 that is operable to provide automated configuration to optimally support video streaming or video conferencing, voice over IP, and mission-critical applications. Cluster management system 222 may also include a guide mode 382 that leads a user step-by-step through the configuration of advanced features and provides advanced online help for contacts-sensitive assistance.

Thus, according to the teachings of the invention, cluster management system 222, which is operable to allow simultaneous configuration and troubleshooting of multiple switches using a standard web browser, is provided. Conventionally such functionality has not been available in rugged Ethernet switches, but the teachings of the invention recognize that such software is useful in industrial settings.

FIG. 9 is a flow chart illustrating a method 400 for IGMP snooping. Such a method, or portions thereof, may be implemented by IGMP snooping block 214. In general, method 400 provides the ability to prune multicast messages using IGMP snooping without the presence of layer 3 device in the network. Pruning refers to blocking of multicast traffic to hosts that have specifically joined that multicast group. Industrial applications have traditionally run on low speed proprietary networks. Many of these applications are based on what is known as a producer-consumer model. Because timing and latency are critical for motion control, these applications multicast data from the producer to the consumer. If there is more than one consumer the data will reach all the consumers at the same time. This is very different than the initial multicast model and Ethernet applications where the multicast source is north of the switch doing the snooping and a router is normally acting as a rendezvous point. In industrial applications the hosts, normally referred to as input/output devices, are generating the multicasts. The teachings of the invention recognize that if traffic is not pruned by the switch, essentially every input/output is flooded with unneeded traffic.

In general, with reference to FIG. 9 IGMP snooping is described. The method begins at step 402. At step 406 (step 404 is skipped for the moment) a querier sends an IGMP query periodically. The querier is normally a router. The query requests are used to assure that the hosts have not left the multicase group previously. At step 406 the clients will send out an IGMP report for the multicast group in response to the query. For IGMP snooping to work properly an IGMP querier is needed. An internal timer is started after every query, as indicated by step 408, and if it does not get a response after a particular time period, such as ten seconds, it presumes the client has left the multicast group. It deletes the interface from the associated layer to the multicast table, as indicated by reference numerals 410 and 412. Normally an IGMP querier will be a Layer 3 interface. If no queriers are present in the network, then the snooping code decides that it can not work properly and thus it will flood all the IP multicast packets within the VLAN. This is not good for the network because the network bandwidth is wasted unnecessarily.

The teachings of the invention recognize that for snooping to work properly an IGMP querier is needed in the VLAN. Thus, the querier functionality is built into Ethernet switch 10 within IGMP snooping block 214 and thus, Ethernet switch 10 queries as illustrated in FIG. 9. According to one embodiment the querier functionality associated with IGMP snooping can be enabled or disabled for Ethernet switch 10 through user configuration, as designated by step 404.

Although some embodiments of the present invention have been disclosed in detail, it should be understood that various changes, substitutions, and alterations can be made thereto without departing in spirit and scope of the invention as defined by appended claims.

What is claimed is:

1. A rugged Ethernet switch comprising:
a housing;
a passive cooling system associated with the housing, the passive cooling system operable to cool the Ethernet switch;
a monitoring system operable to:
 detect a functional failure in the Ethernet switch; and
 transmit a signal to an external device upon detecting the functional failure in the switch; and
software operable to provide an auto quality of service (QoS) functionality for the Ethernet switch that detects a desired quality of service and automatically configures the Ethernet switch for appropriate classification and egress queuing.

2. The rugged Ethernet switch of claim 1, wherein the housing is rugged and contains mounting holes on at least two different sides of the housing.

3. The rugged Ethernet switch of claim 1, wherein the Ethernet switch is operable to transmit a video stream.

4. The rugged Ethernet switch of claim 1, wherein the functional failure is a power failure in the Ethernet switch.

5. The rugged Ethernet switch of claim 1, wherein the functional failure is a failure of a port in the Ethernet switch.

6. The rugged Ethernet switch of claim 1, wherein the functional failure is a temperature rising above an acceptable level in the Ethernet switch.

7. The rugged Ethernet switch of claim 1, wherein the functional failure is a failure other than a failure of a port, a power failure, or a temperature rising above an acceptable level in the Ethernet switch.

8. The rugged Ethernet switch of claim 1, wherein the auto QoS functionality classifies or reclassifies a traffic flow or packet groups based on a QoS field.

9. The rugged Ethernet switch of claim 8, wherein the QoS field is one of a Differentiated Services Code Point (DSCP) field or an 802.1P class of service (CoS) field.

10. The rugged Ethernet switch of claim 1, wherein the auto QoS functionality classifies or reclassifies a traffic flow or packet groups based on one of an internet protocol (IP) addresses, or a media access control (MAC) address.

11. The rugged Ethernet switch of claim 1, wherein the auto QoS functionality schedules queues for processing using weighted round robin scheduling.

12. The rugged Ethernet switch of claim 1, wherein the auto QoS functionality schedules queues for processing using strict priority scheduling.

13. The rugged Ethernet switch of claim 1, wherein the auto QoS functionality schedules queues for processing using both strict priority scheduling and weighted rounding scheduling.

14. The rugged Ethernet switch of claim 1, wherein the auto QoS functionality is operable to classify, reclassify, police, mark and drop incoming packets before the packet is placed into a shared buffer of the Ethernet switch.

15. A rugged Ethernet switch comprising:
a rugged housing means for housing the Ethernet switch;
a means for passively cooling the Ethernet switch;
means on the Ethernet switch for detecting functional failure in the Ethernet switch and for transmitting a signal to an external device upon detecting the functional failure in the switch; and
means on the Ethernet switch for providing an auto quality of service (QoS) functionality for the Ethernet switch that detects a desired quality of service and automatically configures the Ethernet switch for appropriate classification and egress queuing.

16. The rugged Ethernet switch of claim 15, wherein the housing is rugged and contains means for mounting on at least two different sides of the housing.

17. The rugged Ethernet switch of claim 15, wherein the Ethernet switch further include mean for transmitting a video stream.

* * * * *